(12) United States Patent
Kang et al.

(10) Patent No.: US 8,040,044 B2
(45) Date of Patent: Oct. 18, 2011

(54) ORGANIC LIGHT EMITTING DEVICE AND METHOD FOR MANUFACTURING THE SAME

(75) Inventors: Min Soo Kang, Daejeon Metropolitan (KR); Se Hwan Son, Daejeon Metropolitan (KR); Hyeon Choi, Daejeon Metropolitan (KR)

(73) Assignee: LG Chem, Ltd., Seoul (KR)

( * ) Notice: Subject to any disclaimer, the term of this patent is extended or adjusted under 35 U.S.C. 154(b) by 959 days.

(21) Appl. No.: 11/988,219

(22) PCT Filed: Jul. 14, 2006

(86) PCT No.: PCT/KR2006/002768
§ 371 (c)(1),
(2), (4) Date: Jan. 3, 2008

(87) PCT Pub. No.: WO2007/011132
PCT Pub. Date: Jan. 25, 2007

(65) Prior Publication Data
US 2009/0039770 A1    Feb. 12, 2009

(30) Foreign Application Priority Data

Jul. 15, 2005   (KR) .................. 10-2005-00644430

(51) Int. Cl.
*H01J 1/62* (2006.01)
*H01J 63/04* (2006.01)
(52) U.S. Cl. ........ 313/504; 313/483; 313/505; 313/506; 313/500; 313/503
(58) Field of Classification Search .................. None
See application file for complete search history.

(56) References Cited

U.S. PATENT DOCUMENTS 5,200,668 A    4/1993   Ohashi et al.
(Continued)

FOREIGN PATENT DOCUMENTS

EP   0 498 979   8/1992
(Continued)

OTHER PUBLICATIONS

Chkoda, L., et al., *Improved Band Alignment for Hole Injection by an Interfacial layer in Organic Light Emitting Devices*, Applied Physics Letters, vol. 77, No. 8, Aug. 21, 2000, pp. 1093-1095.

(Continued)

*Primary Examiner* — Natalie K Walford
(74) *Attorney, Agent, or Firm* — McKenna Long & Aldridge LLP

(57) ABSTRACT

Disclosed is an organic light emitting device and a method for manufacturing the same. The organic light emitting device includes a first electrode, one or more organic compound layers, and a second electrode. The first electrode includes a conductive layer and an n-type organic compound layer disposed on the conductive layer. A difference in energy between an LUMO energy level of the n-type organic compound layer of the first electrode and a Fermi energy level of the conductive layer of the first electrode is 4 eV or less. One of the organic compound layers interposed between the n-type organic compound layer of the first electrode and the second electrode is a p-type organic compound layer forming an NP junction along with the n-type organic compound layer of the first electrode. A difference in energy between the LUMO energy level of the n-type organic compound layer of the first electrode and an HOMO energy level of the p-type organic compound layer is 1 eV or less. One or more layers interposed between the conductive layer of the first electrode and the second electrode is n-doped or p-doped with an organic material or an inorganic material.

20 Claims, 5 Drawing Sheets

U.S. PATENT DOCUMENTS

| | | | |
|---|---|---|---|
| 5,645,948 A | 7/1997 | Shi et al. | |
| 5,998,803 A | 12/1999 | Forrest et al. | |
| 6,013,384 A | 1/2000 | Kido et al. | |
| 6,171,715 B1 | 1/2001 | Sato et al. | |
| 6,278,127 B1* | 8/2001 | Dodabalapur et al. | 257/40 |
| 6,337,492 B1 | 1/2002 | Jones et al. | |
| 6,436,559 B1 | 8/2002 | Ueno et al. | |
| 6,690,028 B2* | 2/2004 | Wakimoto et al. | 257/40 |
| 6,812,638 B2* | 11/2004 | Wakimoto et al. | 313/505 |
| 6,908,783 B1 | 6/2005 | Kuehl et al. | |
| 7,151,007 B2* | 12/2006 | Werner et al. | 438/99 |
| 7,301,278 B2* | 11/2007 | Shiratori et al. | 313/506 |
| 7,485,733 B2* | 2/2009 | Kim et al. | 549/29 |
| 7,560,175 B2* | 7/2009 | Son et al. | 428/690 |
| 7,830,089 B2* | 11/2010 | Murano et al. | 313/506 |
| 2003/0170491 A1 | 9/2003 | Liao et al. | |
| 2005/0061232 A1 | 3/2005 | Werner et al. | |
| 2005/0134174 A1 | 6/2005 | Shiratori et al. | |
| 2007/0122656 A1 | 5/2007 | Klubek et al. | |
| 2009/0261354 A1* | 10/2009 | Ha et al. | 257/87 |

FOREIGN PATENT DOCUMENTS

| | | |
|---|---|---|
| EP | 1 339 112 A2 | 8/2003 |
| EP | 1 351 558 A1 | 10/2003 |
| JP | 08-096964 | 4/1996 |
| JP | 2003-45676 A | 2/2003 |
| JP | 2003-272860 | 9/2003 |
| JP | 2004-107263 | 4/2004 |
| JP | 2005-063960 | 3/2005 |
| JP | 2005-183213 | 7/2005 |
| JP | 2007-039405 | 2/2007 |
| KR | 1020030067773 A | 8/2003 |
| KR | 10-2004-0028954 A | 4/2004 |
| KR | 10-2005-0020663 A | 3/2005 |
| KR | 10-2005-0021919 A | 3/2005 |
| KR | 10-2005-0042734 A | 5/2005 |
| KR | 1020050049436 A | 5/2005 |
| KR | 1020050049436 A | 5/2005 |
| KR | 1020070052764 A | 5/2007 |
| KR | 1020070118711 A | 12/2007 |
| WO | WO 03/083958 A2 | 10/2003 |
| WO | WO 2004/054326 | 6/2004 |
| WO | WO 2005/097756 A1 | 10/2005 |

OTHER PUBLICATIONS

Kahn, A., et al., *Electronic Structure and Electrical Properties of Interfaces Between Metals and πConjugated Molecular Films*, Journal of Polymer Science: Part B: Polymer Physics, vol. 41 (2003), pp. 2529-2548.

Hung, L.S., et al., *Recent Progress of Molecular Organic Electroluminescent Materials and Devices*, Materials Science and Engineering R 39, (2002) pp. 143-222.

Bulović, V., et al., *Study of Localized and Extended Excitons in 3,4,9,10-Perylenetetracarboxylic Dianhydride (PTCDA) I. Spectroscopic Properties of Thin Films and Solutions*, Chemical Physics 210 (1996) pp. 1-12.

Katz, H.E., *Organic Molecular Solids as Thin Film Transistor Semiconductors*, J. Mater Chem., 1997, 7(3), pp. 369-376).

Kido, J., et al., *Bright Organic Electroluminescent Devices Having a Metal-Doped Electron-Injecting Layer*, Applied Physics Letters, vol. 73, No. 20, Nov. 16, 1998, pp. 2866-2868.

Scott, J. C., et al., *Injection, Transport and Recombination in Organic Light-Emitting Diodes*, SPIE Vo.. 3476, Jul. 1998, pp. 111-122.

"Silver and Silver Alloys", Kirk-Othmer Encyclopedia of Chemical Technology, Fifth Edition.

Suo et al.: "Organic electroluminescent characteristics of PS:NPB composite hole transporting layer", Front. Optoelectron. China 2008, 1(3-4): 323-328.

* cited by examiner

[Figure 1]
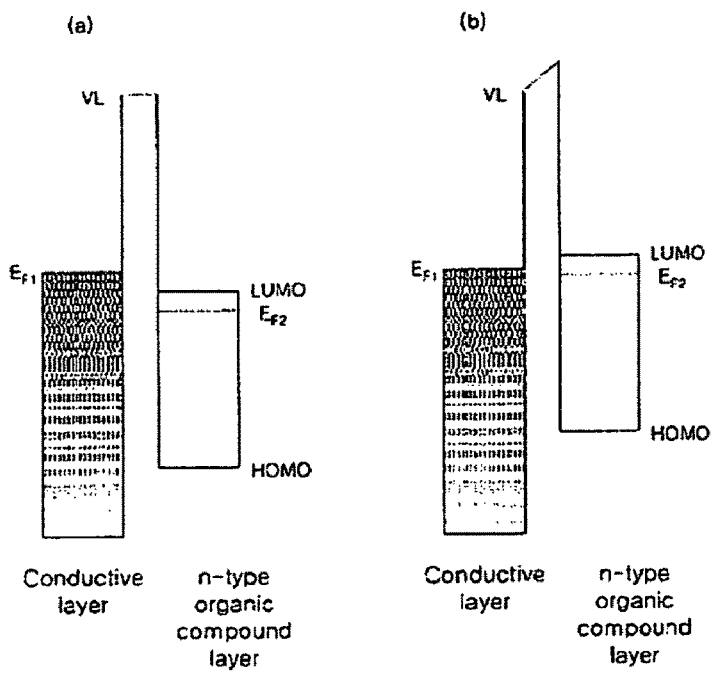
[Figure 2]
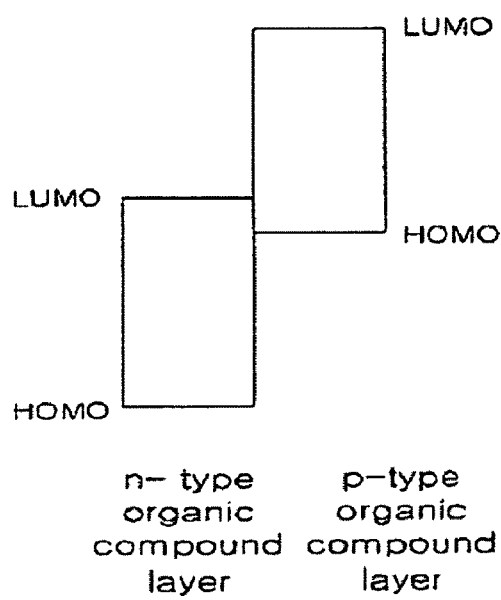

[Figure 3]
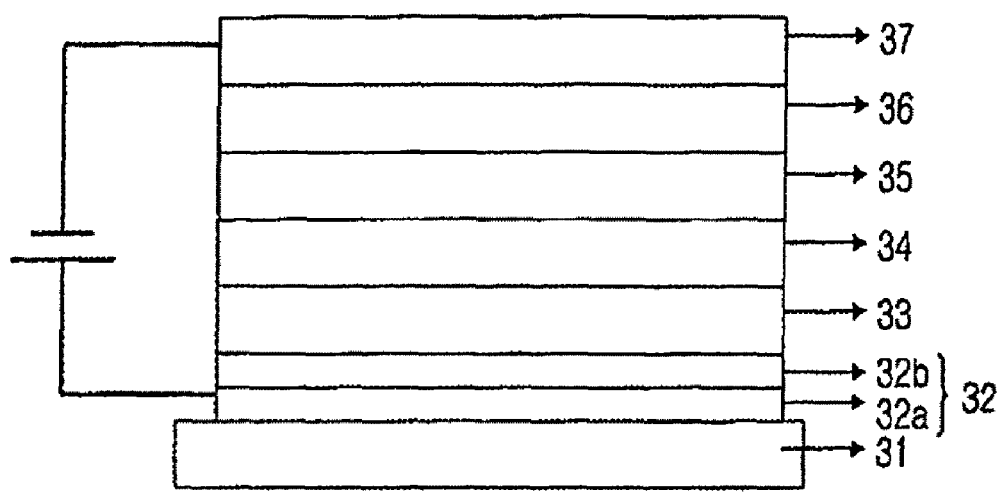

[Fig. 4]
Prior Art
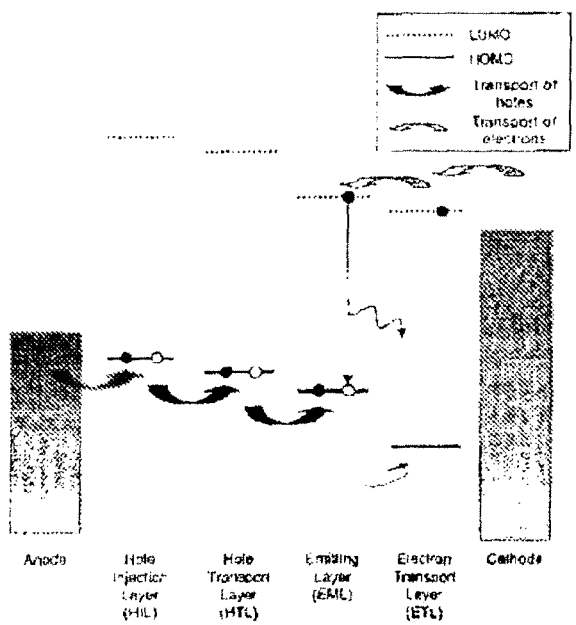
[Fig. 5]
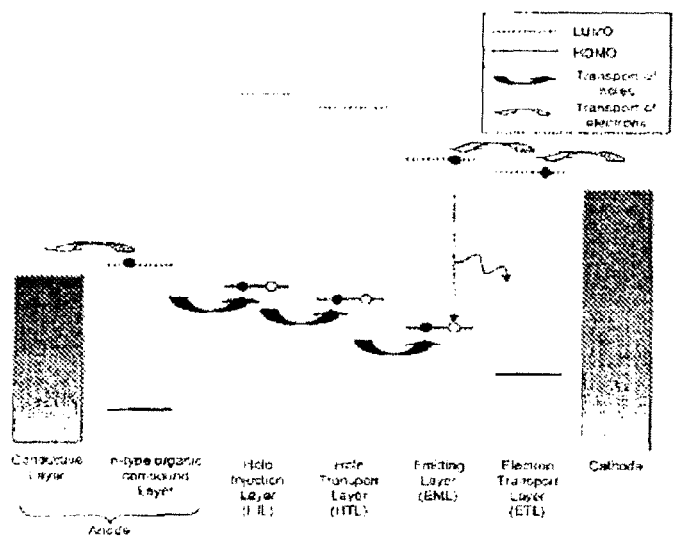
[Fig. 6]
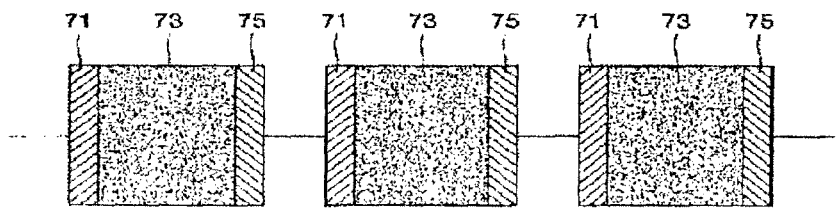

[Figure 7]
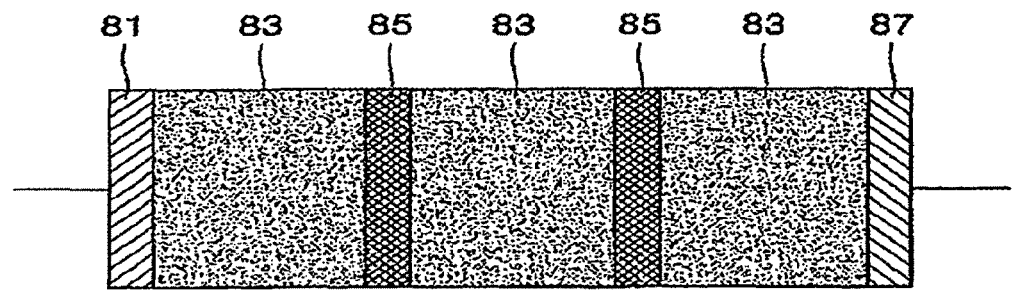
[Figure 8]
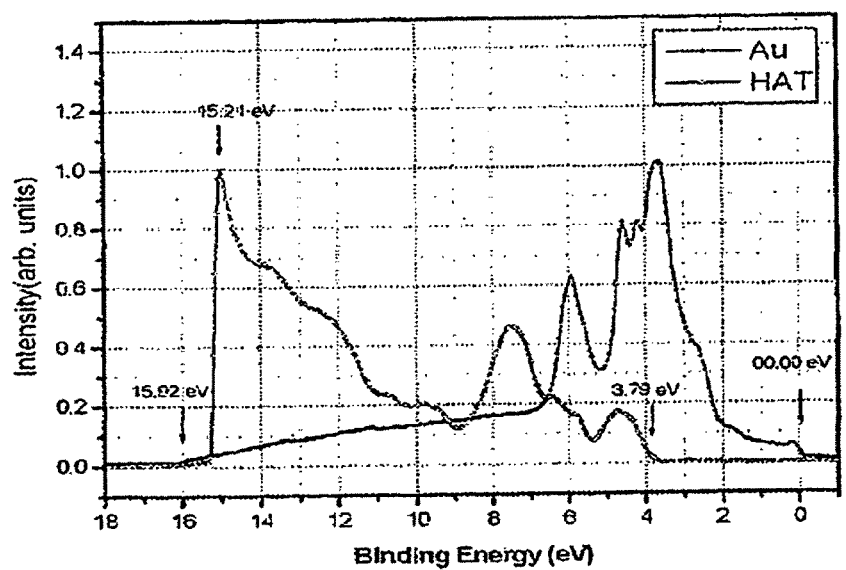

[Figure 9]
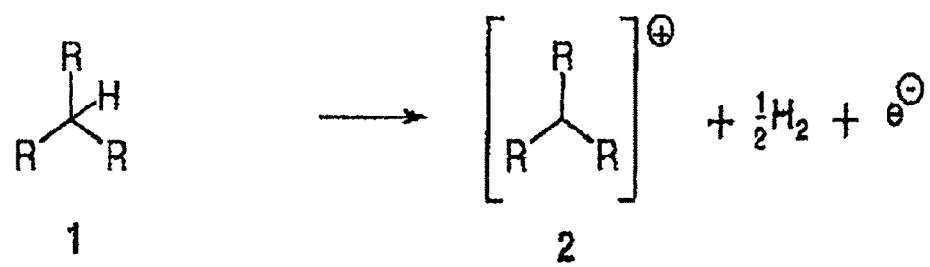
R = 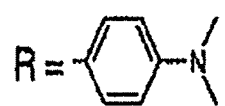

ORGANIC LIGHT EMITTING DEVICE AND METHOD FOR MANUFACTURING THE SAME

This application claims the benefit of the filing date of Korean Patent Application No. 10-2005-0064430 filed on Jul. 15, 2005 in the Korean Intellectual Property Office and International Application PCT/KR2006/002768 filed Jul. 14, 2006, both of which are incorporated herein in its entirety by reference.

TECHNICAL FIELD

The present invention relates to an organic light emitting device that has a low energy barrier for hole injection from an electrode to an organic compound layer, a low driving voltage, and high efficiency and luminance, and to a method for manufacturing the organic light emitting device. Specifically, the present invention relates to an organic light emitting device, in which an n-type organic compound layer is formed in a hole injection electrode, and at least one layer of organic compound layers is n-doped or p-doped with an organic or inorganic material, and a method for manufacturing the organic light emitting device. This application claims the benefit of the filing date of Korean Patent Application No. 10-2005-0064430 filed on Jul. 15, 2005 in the Korean Intellectual Property Office, the disclosure of which is incorporated herein by reference in its entirety.

BACKGROUND ART

In general, an organic light emitting device includes two electrodes and an organic compound layer interposed between the electrodes. In the organic light emitting device, electrons and holes are injected into the organic compound layer from the two electrodes, and a current is converted into visible light. In the organic light emitting device, in order to improve performance, an electron/hole injection layer or an electron/hole transport layer may be further provided, in addition to the organic compound layer for converting the current into visible light.

However, an interface between the electrode formed of metal, metal oxides, or conductive polymers and the organic compound layer is unstable. Accordingly, heat applied from the outside, internally generated heat, or an electric field applied to the device has an adverse effect on performance of the device. Further, a driving voltage for device operation may be increased due to a difference in conductive energy level between the electron/hole injection layer or the electron/hole transport layer and another organic compound layer adjacent thereto. Accordingly, it is important to stabilize an interface between the electron/hole injection layer or the electron/hole transport layer and another organic compound layer and to minimize an energy barrier for injection of electrons/holes from the electrode to the organic compound layer.

The organic light emitting device has been developed so as to adjust a difference of energy level between two or more electrodes and an organic compound layer interposed between the electrodes. In the organic light emitting device, an anode is adjusted to have a Fermi energy level similar to an HOMO (highest occupied molecular orbital) energy level of a hole injection layer or a material having an HOMO energy level similar to a Fermi energy level of an anode is selected for a hole injection layer. However, since the hole injection layer needs to be selected in view of an HOMO energy level of a hole transport layer or a light emitting layer close to the hole injection layer as well as in view of the Fermi energy level of the anode, there is a limitation to select a material for the hole injection layer.

Accordingly, in the method for manufacturing an organic light emitting device, a method of adjusting a Fermi energy level of an anode is adopted. However, a material for the anode is limited.

Meanwhile, it has been known that performance characteristics of a device having multi organic compound layers are affected by transport ability of charge carriers of each organic compound layer. Upon operation, resistance loss to be generated in a charge transport layer is in connection with conductivity, and conductivity has a great effect on a required operation voltage and a thermal load of the device. A band bending phenomenon occurs near a contact point between metal and the organic compound layer according to a concentration of charge carriers of the organic compound layer. With this phenomenon, charge carriers can be easily injected and contact resistance can be reduced.

DISCLOSURE

Technical Problem

The present invention has been finalized in view of the drawbacks inherent in the related art, and it is an object of the present invention to provide an organic light emitting device that exhibits excellent performance and has a simplified manufacturing process by reducing an energy barrier for hole injection and improving charge transport ability of a charge transport organic compound layer.

Technical Solution

An aspect of the present invention provides an organic light emitting device comprising a first electrode, one or more organic compound layers, and a second electrode, wherein the first electrode includes a conductive layer and an n-type organic compound layer disposed on the conductive layer, a difference in energy between an LUMO energy level of the n-type organic compound layer of the first electrode and a Fermi energy level of the conductive layer of the first electrode is 4 eV or less, one of the organic compound layers interposed between the n-type organic compound layer of the first electrode and the second electrode is a p-type organic compound layer forming an NP junction along with the n-type organic compound layer of the first electrode, a difference in energy between the LUMO energy level of the n-type organic compound layer of the first electrode and an HOMO energy level of the p-type organic compound layer is 1 eV or less, and one or more layers interposed between the conductive layer of the first electrode and the second electrode is n-doped or p-doped with an organic material or an inorganic material.

Another aspect of the present invention provides a method for manufacturing an organic light emitting device, which includes a first electrode, one or more organic compound layers, and a second electrode. The method comprises forming an n-type organic compound layer on a conductive layer so as to form a first electrode, forming a p-type organic compound layer on the n-type organic compound layer of the first electrode, and forming one or more layers of the organic compound layers by n-doping or p-doping using an organic material or an inorganic material.

Hereinafter, the present invention will be specifically described. However, the accompanying drawings and the following detailed description are illustrative but not intended to limit the present invention. Various changes can be made without departing from the scope of the present invention.

An organic light emitting device according to an illustrative embodiment of the present invention includes a first electrode for injecting holes, a second electrode for injecting electrodes, and an organic compound layer having p-type semiconductor characteristics (hereinafter, simply referred to as "p-type organic compound layer") interposed between the first electrode and the second electrode. The p-type organic compound layer includes a hole injection layer, a hole transport layer or an emitting layer. The organic light emitting device may further include at least one organic compound layer between the p-type organic compound layer and the second electrode. When the organic light emitting device includes a plurality of organic compound layers, the organic compound layers may be formed of the same material or different materials.

The first electrode includes a conductive layer and an organic compound layer having n-type semiconductor characteristics (hereinafter, simply referred to as "n-type organic compound layer") located on the conductive layer. The conductive layer includes metal, metal oxides, or conductive polymers. The conductive polymer may include electrical conductive polymer. The conductive layer of the first electrode may be formed of the same material as the second electrode.

The n-type organic compound layer has a predetermined LUMO energy level with respect to a Fermi energy level of the conductive layer and an HOMO energy level of the p-type organic compound layer. The n-type organic compound layer of the first electrode is selected such that a difference in energy between the LUMO energy level of the n-type organic compound layer of the first electrode and the Fermi energy level of the conductive layer of the first electrode and a difference in energy between the LUMO energy level of the n-type organic compound layer and the HOMO energy level of the p-type organic compound layer are reduced. Accordingly, holes are easily injected into the HOMO energy level of the p-type organic compound layer through the LUMO energy level of the n-type organic compound layer of the first electrode.

The difference in energy between the LUMO energy level of the n-type organic compound layer of the first electrode and the Fermi energy level of the conductive layer of the first electrode is preferably 4 eV or less (not including 0 eV). In view of material selection, more preferably, the difference in energy is in a range of about 0.01 to 4 eV. The difference in energy between the LUMO energy level of the n-type organic compound layer of the first electrode and the HOMO energy level of the p-type organic compound layer is preferably 1 eV or less (not including 0 eV), and more preferably, is about 0.5 eV or less (not including 0 eV). In view of material selection, more preferably, the difference is in a range of about 0.01 to 1 eV.

If the difference in energy between the LUMO energy level of the n-type organic compound layer of the first electrode and the Fermi energy level of the conductive layer of the first electrode is larger than 4 eV, an effect of a surface dipole or a gap state on an energy barrier for hole injection is reduced. If the difference in energy between the LUMO energy level of the n-type organic compound layer and the HOMO energy level of the p-type organic compound layer is larger than 1 eV, an NP junction between the p-type organic compound layer and the n-type organic compound layer of the first electrode does not easily occur, which causes an increase in driving voltage for hole injection.

The differences in energy between the LUMO energy level of the n-type organic compound layer, and the Fermi energy level of the conductive layer of the first electrode and the HOMO energy level of the p-type organic compound layer are larger than about 0 eV.

FIGS. 1(a) and 1(b) show the energy level of the first electrode before and after application of the n-type organic compound layer to the first electrode for hole injection in the organic light emitting device according to the illustrative embodiment of the present invention. Referring to FIG. 1(a), the conductive layer has a Fermi energy level $E_{F1}$ higher than a Fermi energy level $E_{F2}$ of the n-type organic compound layer. A vacuum level VL represents an energy level at which electrons freely move in the conductive layer and the n-type organic compound layer.

When the organic light emitting device uses the n-type organic compound layer as a portion of the first electrode, the conductive layer comes into contact with the n-type organic compound layer. Referring to FIG. 1(b), since electrons move from the conductive layer to the n-type organic compound layer, the Fermi energy levels $E_{F1}$ and $E_{F2}$ of the two layers are made equal to each other. Consequently, the surface dipole is formed at the interface of the conductive layer and the n-type organic layer, and the vacuum level, the Fermi energy level, the HOMO energy level, and the LUMO energy level are changed as shown in FIG. 1(b).

Accordingly, even though the difference between the Fermi energy level of the conductive layer and the LUMO energy level of the n-type organic compound layer is large, the energy barrier for hole injection can be reduced by bringing the conductive layer into contact with the n-type organic compound layer. Further, when the conductive layer has a Fermi energy level larger than the LUMO energy level of the n-type organic compound layer, electrons move from the conductive layer to the n-type organic compound layer, and a gap state is formed at an interface between the conductive layer and the n-type organic compound layer. Therefore, the energy barrier for electron transport is minimized.

The n-type organic compound layer includes, but not limited to, 2,3,5,6-tetrafluoro-7,7,8,8-tetracyanoquinodimethane (F4TCNQ), fluoro-substituted 3,4,9,10-perylenetetracarboxylic dianhydride (PTCDA), cyano-substituted PTCDA, naphthalene-tetracaboxylic-dianhydride (NTCDA), fluoro-substituted NTCDA, cyano-substituted NTCDA, or hexanitrile hexaazatriphenylene (HAT), which has an LUMO energy level of about 5.24 eV.

The organic light emitting device according to the present invention includes a p-type organic compound layer that comes into contact with the n-type organic compound layer of the first electrode for hole injection. Accordingly, the NP junction is formed in the device. FIG. 2 shows an NP junction formed between the n-type organic compound layer of the first electrode and the p-type organic compound layer.

When the NP junction is formed, the difference in energy level between the LUMO energy level of the n-type organic compound layer of the first electrode and the HOMO energy level of the p-type organic compound layer is reduced. Accordingly, holes or electrons are easily formed by an external voltage or light source. That is, with the NP junction, holes are easily formed in the p-type organic compound layer, and electrons are easily formed in the n-type organic compound layer of the first electrode. Since the holes and electrons are simultaneously formed in the NP junction, the electrons are transported to the conductive layer of the first electrode through the n-type organic compound layer of the first electrode, and the holes are transported to the p-type organic compound layer.

In order to allow the holes to be efficiently transported to the p-type organic compound layer by the NP junction, the difference in energy level between the LUMO energy level of the n-type organic compound layer of the first electrode and the HOMO energy level of the p-type organic compound layer needs to be a predetermined level. Accordingly, the difference between the LUMO energy level of the n-type organic compound layer of the first electrode and the HOMO energy level of the p-type organic compound layer is preferably about 1 eV or less, and more preferably, is about 0.5 eV or less.

In the organic light emitting device according to the present invention, one or more layers of the organic compound layers interposed between the conductive layer of the first electrode and the second electrode are preferably n-doped or p-doped with an organic material or an inorganic material. In the present invention, the organic compound layer n-doped or p-doped with the organic material or the inorganic material may be the n-type organic compound layer as a portion of the first electrode, may be a p-type organic compound layer close to the n-type organic compound layer, or may be another organic compound layer disposed between the p-type organic compound layer and the second electrode.

In the present invention, as described above, a density of charge carriers in the organic compound layer is increased by the organic compound layer n-doped or p-doped with the organic material or the inorganic material, thereby improving charge transport efficiency in the device. Specifically, the density of charge carriers in the organic compound layer is significantly increased by doping an appropriate acceptor material into a hole transport layer (p-doping) or doping an appropriate doner material into an electron transport layer (n-doping), and, as a result, the charge conductivity is significantly increased.

Particularly, in the present invention, as described above, with the first electrode having the conductive layer and the n-type organic compound layer, and the p-type organic compound layer forming the NP junction along with the n-type organic compound layer of the first electrode, the energy barrier for hole injection from the first electrode to the organic compound layer can be significantly reduced. Accordingly, hole injection and transport from the first electrode to a light emitting region of the organic light emitting device can be efficiently performed. In the organic light emitting device according to the present invention having high hole injection efficiency as describing above, when the organic compound layer for electron injection and/or transport is n-doped with an organic material or an inorganic material in order to improve electron transport ability, electrons as well as holes may reach the light emitting region of the device at high concentration. Accordingly, the organic light emitting device according to the present invention can exhibit excellent low voltage, high luminance, and high efficiency characteristics.

In the present invention, the organic material or the inorganic material doped into the organic compound layer can include a known material in the art as long as it can improve electron or hole transport ability by n-doping or p-doping the organic compound layer. For example, the inorganic material doped into the organic compound layer includes Li, Na, K, Rb, Cs, and the like. Further, the organic material doped into the organic compound layer includes an organic material having cyclopentadiene, cycloheptatriene, or six-membered hetero ring, or a condensed ring having the cyclopentadiene, cycloheptatriene, or six-membered hetero ring, and specifically, a xanthene-based organic material, an acridine-based organic material, a diphenylamine-based organic material, an azine-based organic material, an oxazine-based organic material, a thiazine-based organic material, a thioxantene-based organic material and the lide. A doped organic material may include 2,3,5,6-tetrafluoro-7,7,8,8-tetracyanoquinodimethane (F4TCNQ).

In the present invention, the organic compound layer n-doped or p-doped with the organic material or the inorganic material can be formed by a known method in the art, but the scope of the present invention is not limited to a specific method.

For example, the doped organic compound layer can be formed by sublimating organic salt, such as HCL salt of pyronin B, so as to prepare a leucobase of an organic material and then evaporating the leucobase along with an organic material to be doped under a vacuum where a substrate, in which the doped organic compound layer is to be formed, exists.

Further, the doped organic compound layer can be formed by pulverizing an organic material to be doped, such as tetrafluorotetracyanoquinodimethane (TCNQ), in a mortar, mixing the pulverized organic material with a dopant dimmer, for example, di-(p-methoxyphenylamine)methyl, and radiating light onto a mixture so as to cause oxidization of the dimmer and electron transport to TCNQ.

In addition, a method that injects an organic material in an uncharged state, for example, a hydrogenated state as a doping material into the organic compound layer to be doped, and converts the uncharged organic material injected into the organic compound layer into cations or radicals, may be used.

Specifically, a hydrogenated organic material can be independently manufactured with no material for the organic compound layer into which the organic material is doped. For example, the hydrogenated organic material can be manufactured by sublimating an organic salt. If necessary, in order to improve yield and purity of the hydrogenated organic material, an additional purifying process can be performed. The hydrogenated organic material is preferably used in a refined state.

The hydrogenated organic material can be directly injected to the organic compound layer to be doped with the organic material by mixture with the material of the organic compound layer to be doped with the organic material and evaporation or by successive evaporation. Since the hydrogenated organic material has nonionic neutral molecules, almost complete sublimation is shown. Accordingly, the sublimation of the hydrogenated organic material has the same action as the evaporation of the hydrogenated organic material.

As described above, the positive ions or radicals of the organic material can be formed by injecting the hydrogenated organic material into the organic compound layer to be doped and separating hydrogen, carbon monoxide, nitrogen, or hydroxy radical from the hydrogenated organic material. The separation can be performed by radiation of light or electron beams. A radiation spectrum used in the radiation of light preferably at least partially overlaps an absorption region of at least one of the hydrogenated form of uncharged organic material and the material of the organic compound layer to be doped with the organic material. N-doping can be performed by a method of moving electrons from the radical formed in the above-described manner to the material of the organic compound layer to be doped with the organic material or p-doping can be performed by a method of allowing the positive ions formed in the above-described manner to receive the electrons from the material of the organic compound layer.

In the invention, the hydrogen, carbon monoxide, nitrogen, or hydroxy radical may be separated from cyclopentadiene, cycloheptatriene, or six-membered hetero ring of the organic material. In case hydrogen, carbon monoxide, nitrogen, or the hydroxy radical is separated from the above-mentioned types of functional groups, electron emission (n-type doping) or electron accepting (p-type doping) is achieved by formation of the 6π-aromatic system.

Furthermore, in case cyclopentadiene, cycloheptatriene, or hexahetero cycle is a portion of the condensed-ring system, the electron emission or the electron accepting is achieved by formation of 8π-, 10π-, 12π-, or (2n)π (n is an integer of 7 or more) systems.

The hydrogenated organic material may be a carbinol base or a leuco base of the cation dye. Typically, it is known that the cation dye has high quantum efficiency with respect to optical power of the organic light emitting device. For example, the cation dye, such as rhodamin B, has high light emitting quantum efficiency when the cation dye is used as a light emitting dopant in the organic light emitting device.

Examples of the cation dye include, but are not limited to xanthene-based dyes, acridine-based dyes, diphenylamine-based dyes, azine-based dyes, oxazine-based dyes, thiazine-based dyes, or thioxanthene-based dyes. For example, the compound that is capable of being converted into cations due to the separation of functional groups having hydrides may be used as the cation dye.

In detail, as an example of the cation dye of the invention, crystal violet may be used. The crystal violet is present in the HCl salt form. If this dye is sublimated, hydrogen chloride is generated and the leuco base of the crystal violet is obtained (1 of FIG. 9).

The leuco-crystal violet 1 is a precursor material, and stable in air where ultraviolet rays are not present. The leuco-crystal violet has an oxidation potential of 0.7 V with respect to an SCE (Saturated calomel electrode). Generally, the material having the oxidation potential of 0.3 V or more with respect to the SCE is considered to be stable in view of dynamics, and has inactivity in air. The stability in air directly affects the precursor material so that the precursor material is capable of being simply treated. The leuco base may be directly used while the leuco base is not be oxidized into cations during the doping process.

It is preferable that the leuco base be added to a desirable organic material, for example the material consisting of fullerene $C_{60}$, in a desirable acceptor concentration of, for example 1:5000 or more, and preferably 1:5000 to 1:10. The concentration of the dopant may be selected depending on the desired conductivity.

Subsequently, the leuco base is oxidized into the cations (2 of FIG. 9), causing n-type doping. In detail, if the leuco base is oxidized, the leuco base is converted into crystal violet cations 2. In this case, the leuco base 1 transports electrons to fullerene, and separates hydrogen.

Since the crystal violet cation has a reduction potential of 0.1 V with respect to a NHE (Normal hydrogen electrode), the crystal violet cation may act as a donor 2 that is still better than other known organic donors stable in air. The typical cation dye is useful to dope the material, such as fullerene $C_{60}$, having the reduction potential of 0 V or less with respect to the SCE.

FIG. 3 illustrates the organic light emitting device according to an embodiment of the invention.

Referring to FIG. 3, the organic light emitting device may include a substrate 31, an anode 32 on the substrate 31, a p-type hole injection layer (HIL) 33 that is formed on the anode 32 and accepts holes from the anode 32, a hole transport layer (HTL) 34 that is formed on the hole injection layer 33 and transports the holes to an emitting layer (EML) 35, the emitting layer 35 that is formed on the hole transport layer 34 and emits light using the holes and electrons, an electron transport layer (ETL) 36 that is formed on the emitting layer 35 and transports the electrons from a cathode 37 to the emitting layer 35, and the cathode 37 that is formed on the electron transport layer 36. The hole transport layer 34, the emitting layer 35, and the electron transport layer 36 may be formed of the same organic material or different organic materials.

In FIG. 3, the anode 32 transports the holes to the hole injection layer 33, the hole transport layer 34, or the emitting layer 35, and includes a conductive layer 32a and an n-type organic layer 32b. The conductive layer 32a is formed of metal, metal oxides, or conductive polymers. A difference in energy between an LUMO energy level of the n-type organic layer 32b and a Fermi energy level of the conductive layer 32a is about 4 eV or less. A difference in energy between the LUMO energy level of the n-type organic layer 32b and an HOMO energy level of the p-type hole injection layer 33 is about 1 eV or less, and preferably about 0.5 eV or less. An NP junction is formed between the n-type organic layer 32b of the anode 32 and the p-type hole injection layer 33.

According to another embodiment of the invention, the organic light emitting device may include a substrate 31, an anode 32 that is formed on the substrate 31, a p-type hole transport layer 34 that is formed on the anode 32, an emitting layer 35 that is formed on the hole transport layer 34, an electron transport layer 36 that is formed on the emitting layer 35, and a cathode 37 that is formed on the electron transport layer 36. The emitting layer 35 and the electron transport layer 36 may be formed of the same organic material or different organic materials.

According to another embodiment of the invention, the organic light emitting device may include a substrate 31, an anode 32 that is formed on the substrate 31, a p-type emitting layer 35 that is formed on the anode 32, an electron transport layer 36 that is formed on the emitting layer 35, and a cathode 37 that is formed on the electron transport layer 36. The electron transport layer 36 may be formed of organic material.

In the another embodiment of the invention, when the hole transport layer 34 or the emitting layer 35 is formed of the p-type organic material, a difference in energy between the LUMO energy level of the n-type organic layer 32b and the HOMO energy level of the p-type hole transport layer 34 or the p-type emitting layer 35 is about 1 eV or less, and preferably about 0.5 eV or less. An NP junction is formed between the n-type organic layer 32b of the anode 32 and the p-type hole transport layer 34 or the p-type emitting layer 35.

If the difference in energy between the LUMO energy level of the n-type organic layer 32b and the Fermi energy level of the conductive layer 32a is more than 4 eV, a surface dipole or gap state effect to an energy barrier for injection of the holes into the p-type hole injection layer 33 is reduced. If the difference in energy between the LUMO energy level of the n-type organic layer 32b and the HOMO energy level of the p-type hole injection layer 33 is more than 1 eV, the holes or the electrons are not easily formed from the p-type hole injection layer 33 or the n-type organic layer 32b, and driving voltage for injection of the holes is increased.

FIG. 4 illustrates ideal energy level of the known organic light emitting device. At the energy level, loss of energy for injection of the holes and the electrons from the anode and the cathode is minimized. FIG. 5 illustrates energy level of the organic light emitting device according to the embodiment of the invention.

With reference to FIG. 5, the organic light emitting device according to another embodiment of the invention includes the anode having the conductive layer and the n-type organic layer (see FIG. 3), the p-type hole injection layer (HIL), the hole transport layer (HTL), the emitting layer (EML), the electron transport layer (ETL), and the cathode. The difference in energy between the LUMO energy level of the n-type organic layer of the anode and the Fermi energy level of the conductive layer of the anode is about 4 eV or less, and the difference in energy between the LUMO energy level of the n-type organic layer of the anode and the HOMO energy level of the p-type hole injection layer is about 1 eV or less. Since the energy barrier for injection of the holes/electrons is lowered by the n-type organic layer of the anode, the holes are easily transported from the anode to the emitting layer using the LUMO energy level of the n-type organic layer of the anode and the HOMO energy level of the p-type hole injection layer.

In the invention, since the n-type organic layer of the anode lowers the energy barrier for injection of the holes from the anode to the p-type hole injection layer, the p-type hole transport layer, or the p-type emitting layer, the conductive layer of the anode may be formed of various conductive materials. For example, the conductive layer may be formed of the same material as the cathode. In case the anode is formed of the same material as the cathode, the organic light emitting device where conductive material has a low work function may be produced.

Since the cathode and the anode may be formed of the same material, as shown in FIG. 6, a stack-type organic light emitting device having the structure that is equivalent to the structure where two or more organic light emitting device units including an organic layer 73 interposed between an anode 71 and a cathode 75 are connected in series may be produced as shown in FIG. 7. The anode 71 includes a conductive layer and an n-type organic layer.

Referring to FIG. 7, the stack-type organic light emitting device according to the invention has a structure where a plurality of repeating units of an organic layer 83 and a middle conductive layer 85 interposed between an anode 81 and a cathode 87 are layered. The anode 81 and the middle conductive layer 85 include a conductive layer and an n-type organic layer. Preferably, the conductive layer is formed of the transparent material that has a work function similar to that of the cathode 87 and visible ray transmissivity of 50% or more. In case opaque metal is used as the material of the conductive layer, it is necessary for the conductive layer to be made thin so that the conductive layer is almost transparent. Examples of the opaque metal may include Al, Ag, Cu, etc. Particularly, in case Al metal forms the conductive layer of the middle conductive layer 85, the conductive layer has a thickness of about 5 to 10 nm. In the case of the stack-type organic light emitting device, luminance is increased in proportion to the number of organic light emitting device units stacked at the same driving voltage. Accordingly, if the organic light emitting device is formed in the stack type, it is possible to produce the organic light emitting device having high luminance.

Hereinafter, layers constituting the organic light emitting device according to the embodiment of the invention will be described in detail. However, the description of layers that function to inject and/or transport charges is only applicable to the case of the layers being not the organic layers where the above-mentioned organic material or inorganic material are doped in the n-type or p-type. The layers as described below may be formed of the single material or a mixture of two or more materials.

Anode

The anode injects the holes into the p-type organic layer, such as the hole injection layer, the hole transport layer, or the emitting layer. The anode includes the conductive layer and the n-type organic layer. The conductive layer includes metal, metal oxides, or conductive polymers. The conductive polymers may include electroconductive polymers.

Since the n-type organic layer lowers the energy barrier for injection of the holes from a first electrode to the p-type organic layer, the conductive layer may be formed of various conductive materials. For example, the conductive layer has a Fermi energy level of about 3.5 to 5.5 eV. Examples of the conductive material include carbon, aluminum, vanadium, chromium, copper, zinc, silver, gold, other metals, and alloys thereof; zinc oxides, indium oxides, tin oxides, indium tin oxides (ITO), indium zinc oxides, and metal oxides that are similar thereto; and mixtures of oxides and metals, such as $ZnO:Al$ and $SnO_2:Sb$. In case the organic light emitting device is a top emission type, opaque material having excellent reflectivity as well as transparent material may be used as the material of the conductive layer. In the case of a bottom emission type of organic light emitting device, transparent material must be used as the material of the conductive layer. If opaque material is used, the layer must be made thin so that the layer is almost transparent.

The n-type organic layer is interposed between the conductive layer and the p-type organic layer, and injects the holes into the p-type organic layer in a low electric field. The n-type organic layer is selected so that a difference in energy between an LUMO energy level of the n-type organic layer of the anode and a Fermi energy level of the conductive layer of the anode is about 4 eV or less and a difference in energy between the LUMO energy level of the n-type organic layer and an HOMO energy level of the p-type organic layer is about 1 eV or less.

For example, the n-type organic layer has the LUMO energy level of about 4 to 7 eV and electron mobility of about $10^{-8}$ $cm^2/Vs$ to 1 $cm^2/Vs$, and preferably $10^{-6}$ $cm^2/Vs$ to $10^{-2}$ $cm^2/Vs$. If the electron mobility is less than $10^{-8}$ $cm^2/Vs$, it is not easy to inject the holes from the n-type organic layer to the p-type organic layer. If the electron mobility is more than 1 $cm^2/Vs$, the injection of the holes is effectively performed. However, in this case, since the layer is typically formed of crystalline organic material, it is difficult to apply the layer to the organic light emitting device using noncrystalline organic material.

The n-type organic layer may be formed of material that is capable of being vacuum deposited or used to form a thin film using a solution process. Examples of the n-type organic material include, but are not limited to 2,3,5,6-tetrafluoro-7,7,8,8-tetracyanoquinodimethane (F4TCNQ), fluorine-substituted 3,4,9,10-perylenetetracarboxylic dianhydride (PTCDA), cyano-substituted PTCDA, naphthalenetetracarboxylic dianhydride (NTCDA), fluorine-substituted NTCDA, cyano-substituted NTCDA, or hexanitrile hexaazatriphenylene (HAT).

Hole injection layer (HIL) or hole transport layer (HTL)

The hole injection layer or the hole transport layer may be formed of the p-type organic layer interposed between the anode and the cathode. Since the p-type hole injection layer or the p-type hole transport layer and the n-type organic layer form an NP junction, the holes formed due to the NP junction are transported through the p-type hole injection layer or the p-type hole transport layer to the emitting layer.

The difference in energy between the HOMO energy level of the p-type hole injection layer or the p-type hole transport layer and the LUMO energy level of the n-type organic layer is about 1 eV or less, and preferably about 0.5 eV or less. Examples of the p-type hole injection layer or the p-type hole transport layer include, but are not limited to arylamine-based compounds, conductive polymers, or block copolymers having both a conjugated portion and an unconjugated portion.

Emitting Layer (EML)

In the emitting layer, the hole transportation and the electron transportation simultaneously occur. Thus, the emitting layer may have both n-type and p-type characteristics. For convenience, the emitting layer may be defined as the n-type emitting layer in case the electron transportation is faster than the hole transportation, and also defined as the p-type emitting layer in case the hole transportation is faster than the electron transportation.

In the n-type emitting layer, since the electron transportation is faster than the hole transportation, light emission occurs at the interface between the hole transport layer and the emitting layer. Accordingly, if the LUMO energy level of the hole transport layer is higher than the LUMO energy level of the emitting layer, higher light emission efficiency may be assured. Examples of the n-type emitting layer include, but are not limited to aluminum tris(8-hydroxyquinoline) ($Alq_3$); 8-hydroxyquinoline beryllium (BAlq); a benzoxazole-based compound, a benzthiazol-based compound, or a benzimidazole-based compound; a polyfluorene-based compound; and a silacyclopentadiene (silole)-based compound.

In the p-type light emitting layer, hole transport is rapider than electron transport, and thus light emission is made in the vicinity of an interface between the electron transport layer and the light emitting layer. Accordingly, if the HOMO energy level of the electron transport layer is lower than the HOMO energy level of the light emitting layer, higher light emission efficiency can be obtained.

In case of using the p-type light emitting layer, an increase effect of light emission efficiency by a change in LUMO energy level of the hole transport layer is smaller as compared to the case where an n-type light emitting layer is used. Accordingly, in case of using the p-type light emitting layer, it is possible to manufacture an organic light emitting device having an NP junction structure between the n-type organic compound layer and the p-type light emitting layer, without using a hole injection layer and a hole transport layer. The p-type light emitting layer includes, but not limited to, a carbazole-based compound, an anthracene-based compound, a polyphenylenevinylene (PPV)-based polymer, or a spiro compound.

Electron Transport Layer (ETL)

As a material for the electron transport layer, a material having large electron mobility so as to receive electrons from a cathode and transport the electrons to the light emitting layer is preferably used. Examples of the electron transport layer includes, but are not limited to aluminum tris-(8-hydroxyquinoline) ($Alq_3$), an organic compound comprising $Alq_3$ structure, or a hydroxy flavone-metal complex compound or a silacyclopentadiene (silole)-based compound.

Cathode

As a material for the cathode, a material having a low work function in order to easily inject electrons into the organic compound layer, such as the hole transport layer or the electron transport layer, is preferably used. The cathode includes, but not limited to, a metal, such as magnesium, calcium, sodium, potassium, titanium, indium, yittrium, lithium, gadolinium, aluminum, silver, tin, and lead or an alloy thereof, or a multilayered material, such as LiF/Al or $LiO_2$/Al. The cathode can be formed of the same material to the conductive layer of the anode. Alternatively, the cathode or the conductive layer of the anode may include a transparent material.

Advantageous Effects

As describe above, the organic light emitting device according to the present invention has a low energy barrier for hole injection and excellent charge transport ability of an organic compound layer for charge transport so as to have excellent device performance, such as efficiency, luminance, or a driving voltage. Further, since various materials can be used as a material for an electrode, a device manufacturing process can be simplified. In addition, since the anode and the cathode can be formed of the same material, a layered organic light emitting device having high luminance can be obtained.

While the disclosure has been described with reference to illustrative embodiments, it will be understood by those skilled in the art that various changes may be made and equivalents may be substituted for elements thereof without departing from the scope of the disclosure. In addition, many modifications may be made to adapt a particular situation or material to the teachings of the disclosure without departing from the essential scope thereof. Therefore, it is intended that the disclosure not be limited to a particular embodiment disclosed as the best mode contemplated for carrying out this disclosure, but that the disclosure will include all embodiments falling within the scope of the appended claims.

DESCRIPTION OF DRAWINGS

FIGS. 1(a) and 1(b) show an energy level of a first electrode before and after application of an n-type organic compound layer to the first electrode for hole injection in an organic light emitting device according to an illustrative embodiment of the present invention, respectively.

FIG. 2 shows an NP junction formed between an n-type organic compound layer of a first electrode for hole injection and a p-type organic compound layer in the organic light emitting device according to the illustrative embodiment of the present invention.

FIG. 3 is a schematic cross-sectional view showing the organic light emitting device according to the illustrative embodiment of the present invention.

FIG. 4 shows an energy level of an organic light emitting device according to the related art.

FIG. 5 shows an energy level of the organic light emitting device according to the illustrative embodiment of the present invention.

FIGS. 6 and 7 are schematic cross-sectional views showing a stacked organic light emitting device according to another embodiment of the present invention.

FIG. 8 is a graph showing UPS (Ultraviolet Photoelectron Spectrum) data of a gold film and an HAT film disposed on the gold film.

FIG. 9 is a schematic view showing a case where leucocrystal violet is converted to crystal violet cation.

REFERENCE NUMERALS

31: Substrate
32: Anode
37: Cathode
33: Hole Injection Layer
34: Hole Transport Layer
35: Light Emitting Layer
36: Electron Transport Layer

MODE FOR INVENTION

A better understanding of the present invention may be obtained in light of the following examples which are set forth to illustrate, but are not to be construed to limit the present invention.

EXAMPLE

Example 1

Measurement of HOMO and LUMO Energy Levels of HAT using UPS and UV-VIS Absorption Methods Hexanitrile hexaazatriphenylene (HAT) was used as the organic material having n-type semiconductor characteristics. In order to measure the HOMO level of HAT, a UPS (Ultraviolet photoelectron spectroscopy) method was used. In the method, kinetic energy of electrons that are discharged from a sample when vacuum UV rays (21.20 eV) emitted from the He lamp are radiated onto the sample in a ultra-vacuum (0 to 8 torr) is analyzed to detect a work function of metal, or to detect ionization energy of organic material, that is, the HOMO level and the Fermi energy level. That is, the kinetic energy of electrons that are discharged from the sample when the vacuum UV rays (21.20 eV) are radiated onto the sample is a difference between 21.2 eV that is vacuum UV energy and electron binding energy of the sample to be measured. Accordingly, a binding energy distribution of molecules in the material of the sample is obtained by analyzing a kinetic energy distribution of electrons discharged from the sample. In connection with this, in case the kinetic energy of the electrons is maximized, the binding energy of the sample has the minimum value. Thereby, the work function (Fermi energy level) and the HOMO level of the sample are determined.

In this example, the work function of gold was measured using the gold film, and the HOMO level of HAT was measured by analyzing the kinetic energy of electrons discharged from HAT material while the HAT material was deposited on the gold film. FIG. 8 illustrates UPS data obtained from the gold film and the HAT film having a thickness of 20 nm on the gold film. Hereinafter, a description will be given using the terminology disclosed in H. Ishii, et al., Advanced Materials, 11, 605-625 (1999).

In FIG. 8, the binding energy (eV) of the x-axis was calculated based on the work function measured from the gold film. That is, in the measurement, the work function of gold was measured, and found to be 5.28 eV that is obtained by subtracting the maximum value (15.92 eV) of binding energy from energy (21.20 eV) of radiated light. The HOMO level of HAT that was obtained by subtracting the difference between the maximum value (15.21 eV) and the minimum value (3.79 eV) of the binding energy from energy of light radiated onto HAT deposited on the gold film was 9.78 eV, and the Fermi energy level was 6.02 V.

Another UV-VIS spectrum was obtained using organic material that was formed by depositing HAT on a surface of glass, and an absorption edge was analyzed, resulting in the finding that the spectrum had a band gap of about 3.26 eV. Thereby, it can be seen that the LUMO of HAT had about 6.54 eV. This value may be changed by exciton binding energy of HAT material. That is, it can be seen that 6.54 eV is larger than the Fermi level (6.02 eV) of the above-mentioned material. The exciton binding energy must be 0.52 eV or more so that the LUMO level is smaller than the Fermi level. Since the exciton binding energy of the organic material typically has 0.5 to 1 eV, it is expected that the LUMO level of HAT has 5.54 to 6.02 eV.

Example 2

A glass substrate (Corning 7059 glass) on which an ITO (indium tin oxide) was applied to a thickness of 1000 Å was put in distilled water where a detergent (Manufacturing company: Fischer Co., and Product No.: 15-335-55) was dissolved to perform washing using ultrasonic waves for 30 min. Subsequently, the glass substrate was put in distilled water to repeat ultrasonic washing for 5 min twice.

Once the distilled water washing was finished, the glass substrate was subjected to ultrasonic washing sequentially using isopropyl alcohol, acetone, and methanol solvents one by one, and then dried. Subsequently, the glass substrate on which ITO was applied was subjected to plasma treatment using a nitrogen plasma in the plasma washing machine at pressure of 14 mtorr under powder condition of 50 W for 5 min. The work function of the surface treated ITO anode was about 4.8 eV.

Subsequently, the glass substrate on which ITO was applied was subjected to plasma treatment using an oxygen plasma in the plasma washing machine at pressure of 14 mtorr under powder condition of 50 W for 5 min. The work function of the surface treated ITO anode was about 5.2 eV.

HAT was vacuum deposited on ITO by heating to a thickness of about 500 Å to form the transparent anode having the ITO conductive layer and the HAT n-type organic layer. The HOMO energy level of HAT was about 9.78 eV. Subsequently, 4,4'-bis[N-(1-naphthyl)-N-phenylamino]biphenyl (NPB) was vacuum deposited to have a thickness of about 400 Å and the HOMO level of about 5.4 eV, thereby forming the p-type hole transport layer. Alq$_3$ (HOMO level=about 5.7 eV) was vacuum deposited on the p-type hole transport layer to a thickness of about 300 Å to form the emitting layer.

0.2% Cs that is alkali metal was doped into the compound (HOMO=5.7 eV and LUMO=2.8 eV) shown in the following Formula 1, and vacuum deposited by heating to a thickness of 200 Å to form the electron transport layer on the emitting layer.

Aluminum layers having a thickness of 2500 Å were sequentially vacuum deposited on the doped electron transport layer to form the cathode, thereby creating the organic light emitting device. In the above-mentioned procedure, the deposition rate of the organic material was maintained at 0.4 to 0.7 Å/sec, and the deposition rate of aluminum was maintained at about 2 Å/sec. The degree of a vacuum of the deposition chamber was maintained at $2 \times 10^{-7}$ to $5 \times 10^{-8}$ torr during the deposition.

[Formula 1]

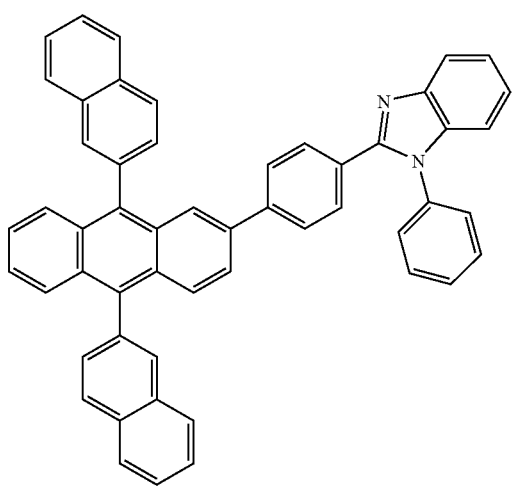

Comparative Example 1

The procedure of example 2 was repeated to produce the organic light emitting device except that the electron transport layer was not doped with Cs, the layer was formed to a thickness of 200 Å using the compound (HOMO=5.7 eV and LUMO=2.8 eV) shown in the above-mentioned Formula 1, and the lithium fluoride LIF thin film having a thickness of 12 Å and the aluminum layer having a thickness of 2500 Å were sequentially vacuum deposited on the electron transport layer to form the cathode. In the above-mentioned procedure, the deposition rate of the organic material was maintained at 0.4 to 0.7 Å/sec, the deposition rate of LiF was maintained at about 0.3 Å/sec, and the deposition rate of aluminum was maintained at about 2 Å/sec. The degree of a vacuum of the deposition chamber was maintained at $2\times10^{-7}$ to $5\times10^{-8}$ torr during the deposition.

TABLE 1

|  | @ 50 mA/cm$^2$ | | @ 100 mA/cm$^2$ | |
| --- | --- | --- | --- | --- |
|  | Voltage (V) | Luminance (cd/cm$^2$) | Voltage (V) | Luminance (cd/cm$^2$) |
|  | 4.3 | 1730 | 4.9 | 3500 |
| Comparative example 1 | 5.1 | 1616 | 5.9 | 3326 |

From Table 1, it can be seen that the device of example 2 where the anode included the ITO conductive layer and the n-type organic layer and the electron transport layer was n-doped had very high luminance at low voltage. Meanwhile, the device of comparative example 1 where the electron transport layer was not doped had relatively large driving voltage and high luminance.

The invention claimed is:

1. An organic light emitting device comprising:
    a first electrode;
    one or more organic compound layers; and
    a second electrode,
    wherein the first electrode includes a conductive layer and an n-type organic compound layer disposed on the conductive layer,
    a difference in energy between the LUMO energy level of the n-type organic compound layer of the first electrode and a Fermi energy level of the conductive layer of the first electrode is 4 eV or less,
    one of the organic compound layers interposed between the n-type organic compound layer of the first electrode and the second electrode is a p-type organic compound layer forming an NP junction along with the n-type organic compound layer of the first electrode,
    a difference in energy between the LUMO energy level of the n-type organic compound layer of the first electrode and the HOMO energy level of the p-type organic compound layer is 1 eV or less, and
    one or more layers interposed between the conductive layer of the first electrode and the second electrode are n-doped or p-doped with an organic material or an inorganic material.

2. The organic light emitting device according to claim 1, wherein the p-type organic compound layer is a hole injection layer, a hole transport layer, or a light emitting layer.

3. The organic light emitting device according to claim 1, further comprising at least one organic compound layer interposed between the p-type organic compound layer and the second electrode.

4. The organic light emitting device according to claim 1, wherein the n-type organic compound layer of the first electrode is formed of an organic material selected from a group consisting of 2,3,5,6-tetrafluoro-7,7,8,8-tetracyanoquinodimethane (F4TCNQ), fluoro-substituted 3,4,9,10-perylenetetracarboxylic dianhydride (PTCDA), cyano-substituted PTCDA, naphthalene-tetracaboxylic-dianhydride (NTCDA), fluoro-substituted NTCDA, cyano-substituted NTCDA, and hexanitrile hexaazatriphenylene (HAT).

5. The organic light emitting device according to claim 1, wherein the conductive layer of the first electrode is formed of a material selected from a group consisting of metal, metal oxide, and conductive polymer.

6. The organic light emitting device according to claim 1, wherein the conductive layer of the first electrode and the second electrode are formed of the same material.

7. The organic light emitting device according to claim 1, wherein at least one of the conductive layer of the first electrode and the second electrode includes a transparent material.

8. The organic light emitting device according to claim 1, wherein the n-type organic compound layer has an LUMO energy ranging from about 4 to 7 eV and electron mobility ranging from about $10^{-8}$ cm$^2$/Vs to 1 cm$^2$/Vs.

9. The organic light emitting device according to claim 1, wherein the inorganic material in the organic compound layer n-doped or p-doped with the organic material or the inorganic material is selected from a group consisting of Li, Na, K, Rb, and Cs.

10. The organic light emitting device according to claim 1, wherein the organic material in the organic compound layer n-doped or p-doped with the organic material or the inorganic material is cyclopentadiene, cycloheptatriene, or six-membered hetero ring, or an organic material comprising a condensed ring having the cyclopentadiene, cycloheptatriene, or six-membered hetero ring.

11. The organic light emitting device according to claim 10, wherein the organic material is selected from a group consisting of a xanthene-based organic material, an acridine-based organic material, a diphenylamine-based organic material, an azine-based organic material, an oxazine-based organic material, a thiazine-based organic material, and a thioxantene-based organic material.

12. The organic light emitting device according to claim 1, wherein the organic compound layer n-doped or p-doped with the organic material or the inorganic material is formed by injecting an uncharged organic material into the organic compound layer to be doped, and separating hydrogen, carbon monoxide, nitrogen, or hydroxy radical from the uncharged organic material so as to allow one or more electrons to move from the organic material to a material of the organic compound layer to be doped, or so as to allow the organic material to receive electrons from a material of the organic compound layer.

13. The organic light emitting device according to claim 12, wherein the separating of hydrogen, carbon monoxide, nitrogen, or hydroxy radical from the uncharged organic material is performed by radiating light or electron beams.

14. The organic light emitting device according to claim 1, wherein the organic compound layer n-doped or p-doped with the organic material or the inorganic material has a doping concentration of 1:5000 to 1:10.

15. The organic light emitting device according to claim 1, wherein the organic compound layer n-doped or p-doped with the organic material or the inorganic material is an organic compound layer for electron injection and/or transport n-doped with an organic material or an inorganic material.

16. A stacked organic light emitting device comprising:
two or more repeating units that each includes a first electrode, one or more organic compound layers, and a second electrode,
wherein the first electrode includes a conductive layer and an n-type organic compound layer disposed on the conductive layer,
a difference in energy between the LUMO energy level of the n-type organic compound layer of the first electrode and a Fermi energy level of the conductive layer of the first electrode is 4 eV or less,
one of the organic compound layers interposed between the n-type organic compound layer of the first electrode and the second electrode is a p-type organic compound layer forming an NP junction along with the n-type organic compound layer of the first electrode,
a difference in energy between the LUMO energy level of the n-type organic compound layer of the first electrode and the HOMO energy level of the p-type organic compound layer is 1 eV or less,
one or more layers interposed between the conductive layer of the first electrode and the second electrode are n-doped or p-doped with an organic material or an inorganic material, and
the second electrode of one repeating unit is connected to the first electrode of adjacent repeating units connected in series.

17. The stacked organic light emitting device according to claim 16, wherein the first electrode and the second electrode located at an interface of repeating units connected in series are formed of a single layer.

18. A method for manufacturing an organic light emitting device, which includes a first electrode, one or more organic compound layers, and a second electrode, comprising:
forming an n-type organic compound layer on a conductive layer so as to form a first electrode;
forming a p-type organic compound layer on the n-type organic compound layer of the first electrode; and
forming one or more layers of the organic compound layers by n-doping or p-doping using an organic material or an inorganic material.

19. The method for manufacturing an organic light emitting device according to claim 18, wherein the forming of one or more layers of the organic compound layers by n-doping or p-doping using an organic material or an inorganic material is performed by injecting an uncharged organic material into the organic compound layer to be doped, and separating hydrogen, carbon monoxide, nitrogen, or hydroxy radical from the uncharged organic material so as to allow one or more electrons to move from the organic material to a material of the organic compound layer to be doped, or so as to allow the organic material to receive electrons from a material of the organic compound layer.

20. The method for manufacturing an organic light emitting device according to claim 19, wherein the separating of hydrogen, carbon monoxide, nitrogen, or hydroxy radical from the uncharged organic material is performed by radiating light or electron beams.

* * * * *